United States Patent [19]
Odom

[11] Patent Number: 6,166,673
[45] Date of Patent: Dec. 26, 2000

[54] DATA ACQUISITION SYSTEM AND METHOD WITH A SELECTABLE SAMPLING RATE

[75] Inventor: B. Keith Odom, Georgetown, Tex.

[73] Assignee: National Instruments Corporation, Austin, Tex.

[21] Appl. No.: 09/162,678

[22] Filed: Sep. 29, 1998

[51] Int. Cl.[7] .................................................. H03M 1/12
[52] U.S. Cl. .......................................... 341/155; 341/161
[58] Field of Search .................................. 341/155, 161, 341/159, 160, 158

[56] References Cited

U.S. PATENT DOCUMENTS

| | | | |
|---|---|---|---|
| 4,866,441 | 9/1989 | Conway et al. | 341/122 |
| 4,968,988 | 11/1990 | Miki et al. | 341/141 |
| 5,745,394 | 4/1998 | Tani | 364/724.1 |
| 5,856,800 | 1/1999 | Le Pailleur et al. | 341/159 |
| 5,914,592 | 6/1999 | Saito | 324/121 |

*Primary Examiner*—Peguy Jean Pierre
*Attorney, Agent, or Firm*—Conley, Rose & Tayon, PC; Jeffrey C. Hood

[57] ABSTRACT

An improved data acquisition system for digitizing and storing analog data at a selectable sample rate. The analog data signal is first digitized at a rate defined by a high-frequency clock signal. A decelerator collects every N digital data samples and outputs the samples to N memory partitions at a reduced rate equal to the original clock frequency divided by N. The N memory partitions are further configured to receive N store-enable signals corresponding to each of the N digital data samples. Each of the N store-enable signals determines whether a memory partition will store the corresponding digital data sample. By choosing an appropriate pattern for the N store-enable signals, only a portion of the generated digital data signals is stored in memory. This results in a selectable effective sampling rate for the analog data.

16 Claims, 5 Drawing Sheets

DATA ACQUISITION SYSTEM AND METHOD WITH A SELECTABLE SAMPLING RATE

Field of the Invention

The present invention relates to measurement systems, and more particularly to a system and method for performing data acquisition at a selectable sampling rate.

Description of the Related Art

Scientists and engineers often use data measurement and acquisition (DAQ) systems to perform a variety of functions, including laboratory research, process monitoring and control, data logging, analytical chemistry, tests and analysis of physical phenomena, and control of mechanical or electrical machinery, to name a few examples. Generally, a process being monitored or otherwise controlled, referred to as the unit under test (UUT), is interfaced to one or more hardware input/output (I/O) interface devices. The I/O interface options include instrumentation associated with the GPIB (general purpose interface bus), the VXI bus, the PXI (PCI eXtensions for Instrumentation), the RS232 protocol, as well as other interfaces as known to those skilled in the art.

DAQ systems typically include transducers for asserting and measuring electrical signals, signal conditioning logic to perform amplification, isolation, and filtering, and other hardware for receiving analog signals and providing them to a processing system, such as a personal computer. The processing system generally comprises a computer system having an I/O bus and corresponding connectors or slots for receiving I/O boards. Typically, plug-in DAQ boards are plugged into the I/O slots of a computer system for interfacing the UUT with the processing system. The computer may further include analysis hardware and software for analyzing and appropriately displaying the measured data.

FIG. 1 shows what may be a possible configuration of a DAQ board. Analog data signal 100 is provided to the DAQ board by a transducer connected to a UUT. The signal is provided to conditioning logic for amplification and filtering before it is provided to the DAQ board. Analog data signal 100 together with clock signal 110 are inputs to analog-to-digital converter (ADC) 120. ADC 120 samples analog data 100 at the frequency of clock 110 and then generates digital data for every sample (typically 8 bits) which is output at the clock frequency.

Decelerator 130 is coupled to ADC 120 and is configured to receive the digital data. Decelerator 130 stores and converts every N of the digital data samples into N parallel data samples. The N parallel data samples are output from the N outputs of decelerator 130 at a second frequency which is equal to the original frequency of the clock divided by N. The decelerated data is stored on board in memory 140. Memory 140 is partitioned into N memory partitions 150. Each memory partition 150 is configured to receive one the N parallel data samples generated by decelerator 130. Memory partitions 150 receive the data samples at the reduced rate of 1/N.

For low frequency applications, the sample clock may be divided by a sample clock divider to adjust the sampling rate. At high frequencies, such a divider is impractical and could introduce an unacceptable amount of timings error into the system.

SUMMARY OF THE INVENTION

The present invention comprises an improved data acquisition system for digitizing and storing analog data at a selectable sample rate. The analog data signal is first digitized at a rate defined by a high-frequency clock signal. A decelerator collects every N digital data samples and outputs the samples to N memory partitions at a reduced rate equal to the original clock frequency divided by N. The N memory partitions are further configured to receive N store-enable signals corresponding to each of the N digital data samples. Each of the N store-enable signals determines whether a memory partition will store the corresponding digital data sample. By choosing an appropriate pattern for the N store-enable signals, only a portion of the generated digital data signals is stored in memory. This results in a selectable effective sampling rate for the analog data.

Broadly speaking, the present invention contemplates an analog-to-digital converter (ADC) configured to receive an analog data signal and a first clock signal having a first clock frequency F1. The ADC is operable to sample the analog data at the first clock frequency F1 and convert samples of the analog data into digital data samples. In a preferred embodiment, the analog data signal is sampled at 1 GHz with each sample being 8 bits long.

The system includes a decelerator which includes an input coupled to the ADC and is configured to receive the digital data samples. The decelerator is operable to store every N of the digital data samples in data buffers within the decelerator. The decelerator further includes N outputs for outputting the N digital data samples in a parallel fashion. The N digital data samples are output at a second clock frequency $F2=F1/N$. The decelerator repetitively operates to receive and store N digital data samples and output the N digital data samples in a parallel fashion. In a preferred embodiment, the decelerator may comprise 8 outputs, outputting data at a rate of 1 GHz/8=125 MHz.

A memory is coupled to the decelerator and is configured to receive the N output digital data samples. The memory comprises a plurality N of memory partitions, each of which is coupled to one of the N outputs of the decelerator and is configured to receive one of the N digital data samples from the decelerator. The N memory partitions are preferably random access memories that are configured as first-in-first-out memories.

The data acquisition system further comprises a control logic unit configured to receive a second clock signal having the second frequency F2. The second clock signal may be provided by a clock divisor configured to receive and divide the first clock signal. The control logic unit generates a sequence of N store-enable signals at the second frequency F2. Each of the N store enable signals corresponds to each of the N digital data samples output by the decelerator. The store-enable signals are generated with a pattern of enable and non-enable bits and then provided to the N memory partitions to selectively store the corresponding digital data samples in selected ones of the N memory partitions. In a preferred embodiment, the N store-enable signals, when placed in sequence, have every Mth of the store-enable signals being enabling, all others of the store-enable signals being non-enabling. This provides an effective sampling rate for the data acquisition system that is equal to the original clock frequency divided by M.

In the preferred embodiment, the data acquisition system further comprises steering logic coupled to the decelerator, the control logic unit, and the memory. The steering logic is configured to receive the N digital data samples from the decelerator and the N store-enable signals from the control logic unit in place of the N memory partitions. The steering logic then outputs, to the N memory partitions, only ones of the N digital data samples that correspond to an enabling signal. The N digital data samples are then output in sequence and in a cyclical fashion to the N memory partitions. This allows for a more efficient use of the memory partitions.

BRIEF DESCRIPTION OF THE DRAWINGS

Other objects and advantages of the invention will become apparent upon reading the following detailed description and upon reference to the accompanying drawings in which.

Figure 1:
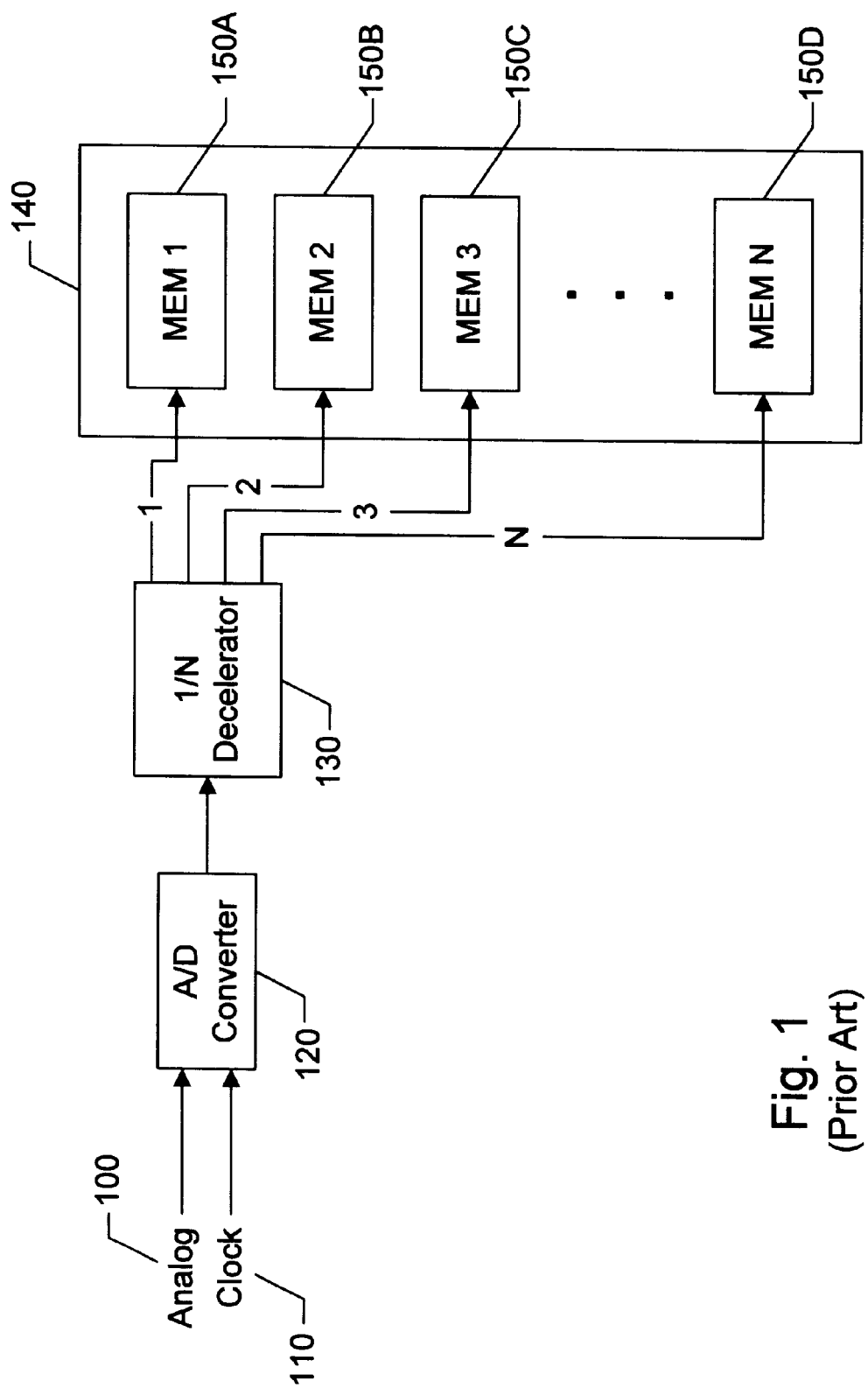
FIG. 1 shows a block diagram of a data acquisition board (Prior Art)

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended Claims.

DETAILED DESCRIPTION OF THE PREFERRED EMBODIMENT

Figure 2:
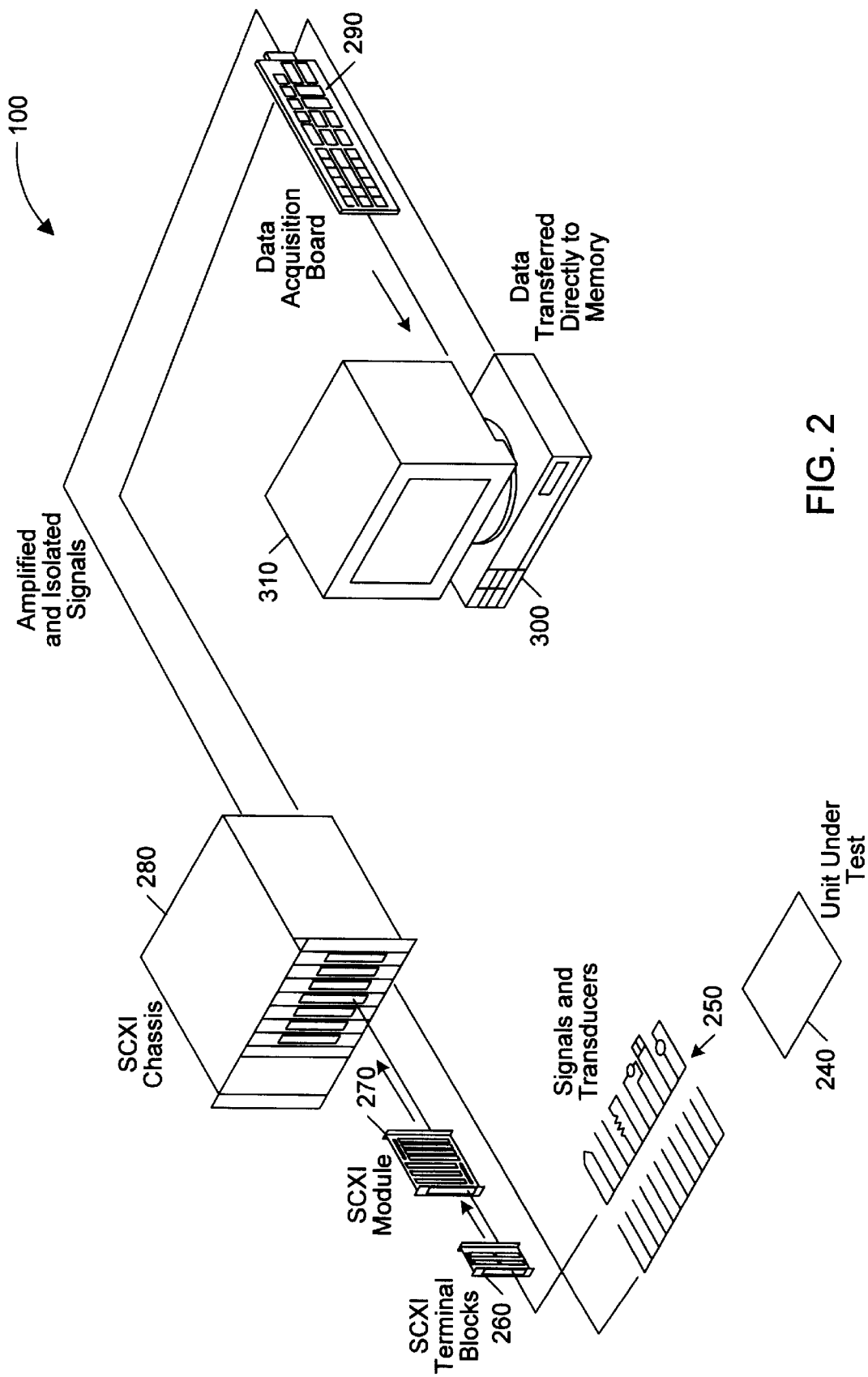
FIG. 2 shows a PC-based data acquisition system.

Referring now to FIG. 2, a perspective diagram of a DAQ system 100 is shown. The DAQ system 100 operates to measure and/or monitor unit under test (UUT) 240. UUT 240 generally represents a process or other physical phenomena being monitored or controlled. As shown, DAQ system 100 includes transducers 250 or other sensing devices for detecting or measuring temperature, pressure, voltage, strain, etc. Transducers 250 are coupled to one or more interface devices, such as Signal-Conditioning-eXtensions-for-Instrumentation (SCXI) terminal block 260 and SCXI module 270. SCXI terminal block 260 and SCXI module 270 are comprised inside SCSI chassis 280 but are shown external to the chassis in FIG. 2 for illustration purposes. SCXI chassis 280 is located near transducer sensors 250. The SCXI devices receive, filter, amplify, and/or condition the low-level, field signals generated by transducers 250. The SCXI devices generate high-level signals that are sent to DAQ board 290 which is comprised in computer system 300. DAQ board 290 is typically plugged into an I/O slot of computer system 300. Computer system 300 includes a memory, such as a non-volatile memory, for storing the collected data, the appropriate software for performing analysis of the collected data as well as a display 310 for optionally displaying the analyzed data in a desirable or understandable format.

Figure 3:
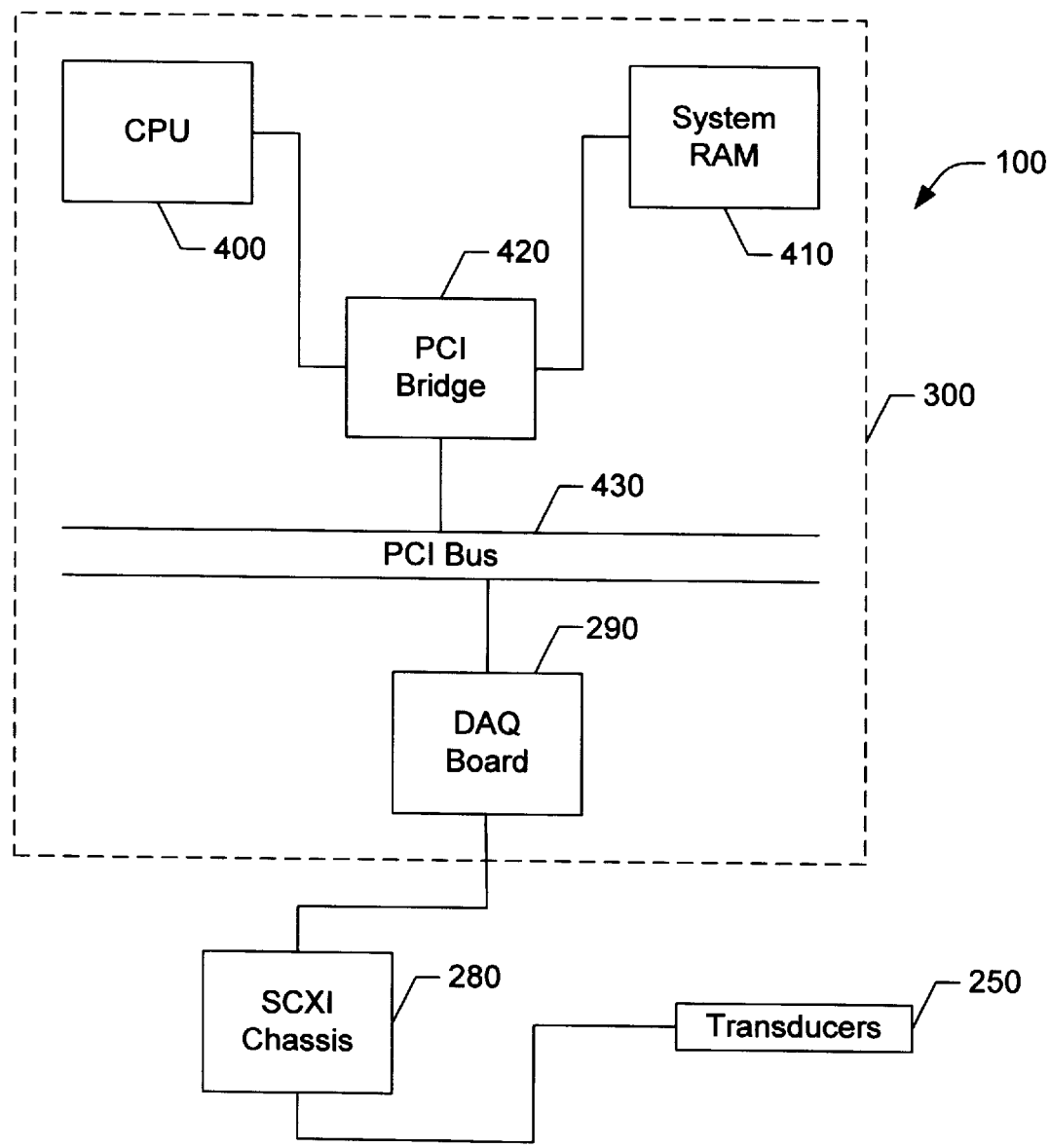
FIG. 3 shows a block diagram of a PC system with a plug-in data acquisition board for collecting and digitizing data.

FIG. 3 shows a block diagram of computer system 300, which is coupled through SCXI chassis 280 to transducers 250. DAQ board 290 is placed into an I/O slot of computer system 300 whereby DAQ board is directly connected to PCI I/O bus 430. DAQ board 290 can receive and transmit data from and to the computer system's random access memory (RAM) 410 through PCI I/O bus 430. PCI bridge 420 interfaces central processing unit (CPU) 400 and system RAM 410 with PCI bus 430. DAQ board 290 receives control signals from CPU 400 that control the board's operation. Data collected by DAQ board 290 from transducers 250 after conditioning at SCXI chassis 280 is transferred to system RAM 410. The digital data is processed by CPU 400 and then appropriately displayed and/or stored in a non-volatile memory, such as a hard disk.

Figure 4:
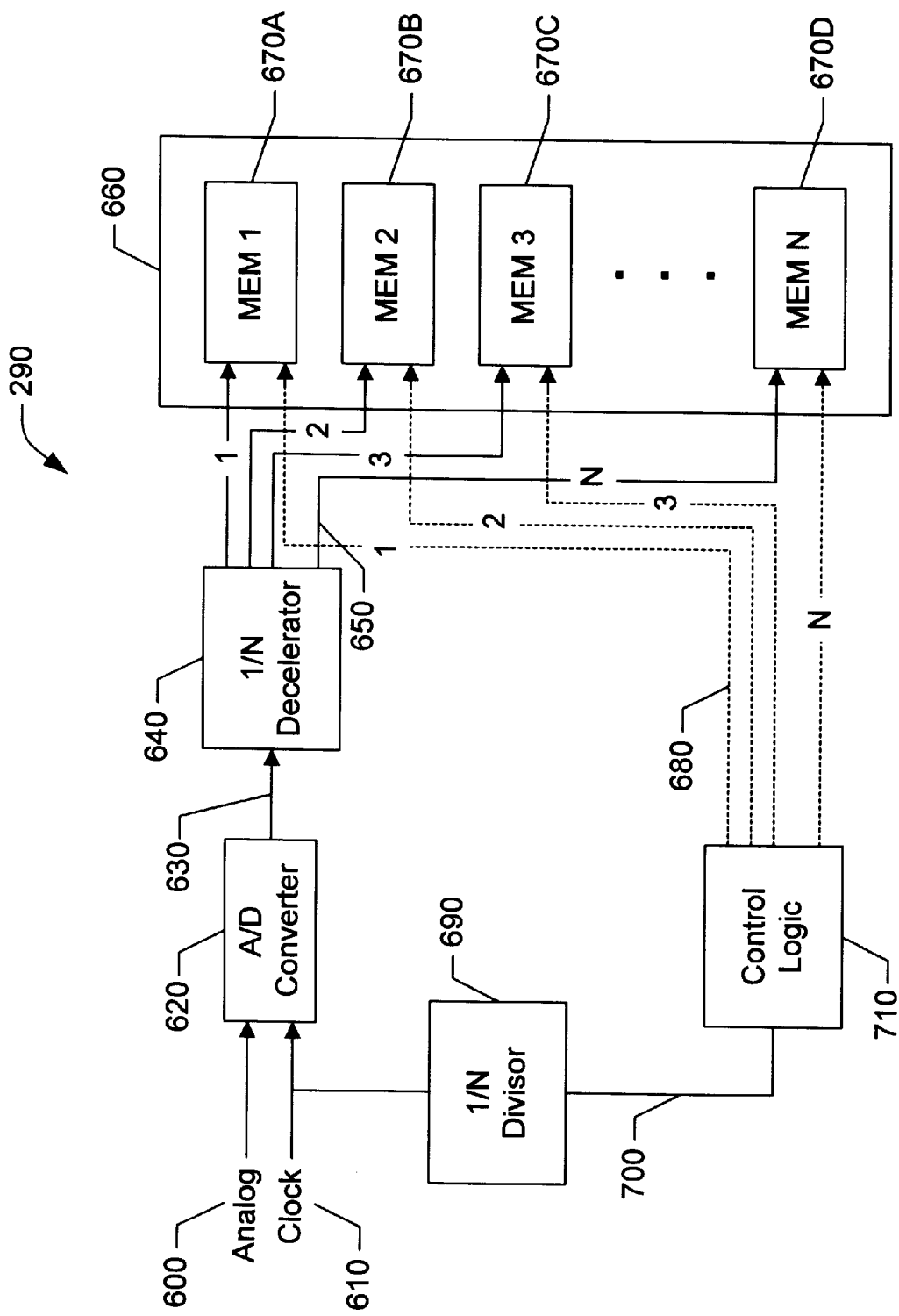
FIG. 4 shows a block diagram of a data acquisition board with a selectable sampling rate.

FIG. 4 shows a block diagram of DAQ board 290. Analog data signal 600 is provided to the board by the transducers after conditioning. Analog data signal 600 together with clock signal 610 are provided to analog-to-digital converter (ADC) 620. Clock signal 610 is generated by an oscillator (not shown) located on DAQ board 290. DAQ board 290 includes only a single oscillator which provides a clock signal at a frequency F1. Despite the presence of only a single oscillator, the present invention allows for a selectable sampling rate for DAQ board 290. In a preferred embodiment, clock signal 610 is oscillating at the high frequency of 1 GHz, i.e., F1=1 GHz. ADC 620 samples analog data signal 600 at the frequency of the clock signal 610 to generate a sequence of digital data samples 630. Each digital data sample represents the amplitude of analog data signal 600 at each sample point in time and is typically 8 bits long.

Decelerator 640 is coupled to ADC 620 and is configured to receive digital data samples 630. Decelerator 640 stores every N of digital data samples 630 in local buffers and then outputs them simultaneously and in a parallel fashion from its N outputs (1, 2, 3, . . , N). Decelerator 640 repetitively receives, stores, and outputs the N digital data samples 650. Digital data samples 650 are output at a frequency which is equal to the original clock frequency F1 divided by N, i.e., F1/N.

The digital data is then stored in on-board memory 660. Memory 660 is partitioned into N memory partitions 670 each of which is configured to receive one of the N parallel outputs of decelerator 640. Partitioning memory 660 in combination with having decelerator 640 ensures that each one of memory partitions 670 is receiving data at a rate which is not greater than the original clock frequency divided by N (F1/N). This is useful when the memory read speed is slower than the maximum desired sampling rate F1.

Memory 660 is further configured to receive N parallel store-enable signals 680, with one store-enable signal corresponding to each of the N memory partitions 670. Store-enable signals 680 are synchronized with parallel data outputs and are provided to memory partitions 670 at the original clock frequency F1 divided by N. Each of the N memory partitions 670 is configured to receive one of the N store-enable signals 680 in addition to one of the N parallel outputs of decelerator 640. When the store-enable bit is 1, the corresponding memory partition stores the corresponding parallel output of decelerator 640. When the store-enable bit is 0, the data is not stored. For negative logic, the reverse is true. This provides a mechanism whereby only a portion of the digital data is stored in memory. The pattern of the store-enable signals determines an effective sampling rate for the data acquisition system. Store-enable signals 680 are discussed further below. On board memory 660 preferably comprises first-in-first-out memory (FIFO) or random access memory (RAM).

Clock signal 610 is also provided to clock divisor 690. Clock divisor 690 divides the original clock signal F1 by N to generate a second clock signal having a second frequency F2 which is equal to the original clock frequency divided by N, i.e., F2=F1/N. Control logic 710 is configured to receive second clock signal 700 and generate the N store-enable signals 680 at a rate equal to the second frequency F2. Store-enable signals 680 determine whether memory partitions 670 will store parallel digital data samples 650. Only a portion of data 650 is stored in memory partitions 670, depending on the pattern generated by control logic 710. By changing the pattern, control logic 710 controls which of the digital samples 650 are stored thereby discarding a portion of the samples. The pattern can be such that only 1 every M samples is stored, which changes the effective sampling frequency of the system to F1/M. Reducing the effective sample rate can enable the user to store data that has been sampled over a longer period of time using the same amount of memory. An example of a pattern that can accomplish a reduced effective sampling rate is shown in the following table. Four memory partitions are assumed (i.e., N=4) with a desired effective sampling rate of ⅓ of the original clock frequency (i.e., M=3, every 3rd sample is stored).

| m | S | c | s | c | s | c | s | c | s | c | s | c |
|---|---|---|---|---|---|---|---|---|---|---|---|---|
| 1 | 1 | 0 | 5 | 0 | 9 | 1 | 13 | 0 | 17 | 0 | 21 | 1 | 25 | 0 |
| 2 | 2 | 0 | 6 | 1 | 10 | 0 | 14 | 0 | 18 | 1 | 22 | 0 | 26 | 0 |
| 3 | 3 | 1 | 7 | 0 | 11 | 0 | 15 | 1 | 19 | 0 | 23 | 0 | 27 | 1 |
| 4 | 4 | 0 | 8 | 0 | 12 | 1 | 16 | 0 | 20 | 0 | 24 | 1 | 28 | 0 |

In the above table:
m: Memory partition number
s: Sample number
c: Control logic pattern As shown in the above example, the N store enable signals, when placed in sequence, have every Mth of the store enabling signals be enabling, with all others of the store enable signals non-enabling. After the above sequence of samples and store-enable signals, the memory partitions have the following contents:

| Memory partition | Contents (sample #s present) |
|---|---|
| 1 | 9, 21 |
| 2 | 6, 18 |
| 3 | 3, 15, 27 |
| 4 | 12, 24 |

The contents of the memory partitions, as shown in the above table, are updated to the right and are read from the left. The correct read sequence of the memory partitions in this case would be: 3, 2, 1, 4, 3, 2, 1, 4, . . . After all the data is collected, the data is transferred to the computer system's RAM for analysis, display, or storage.

Figure 5:
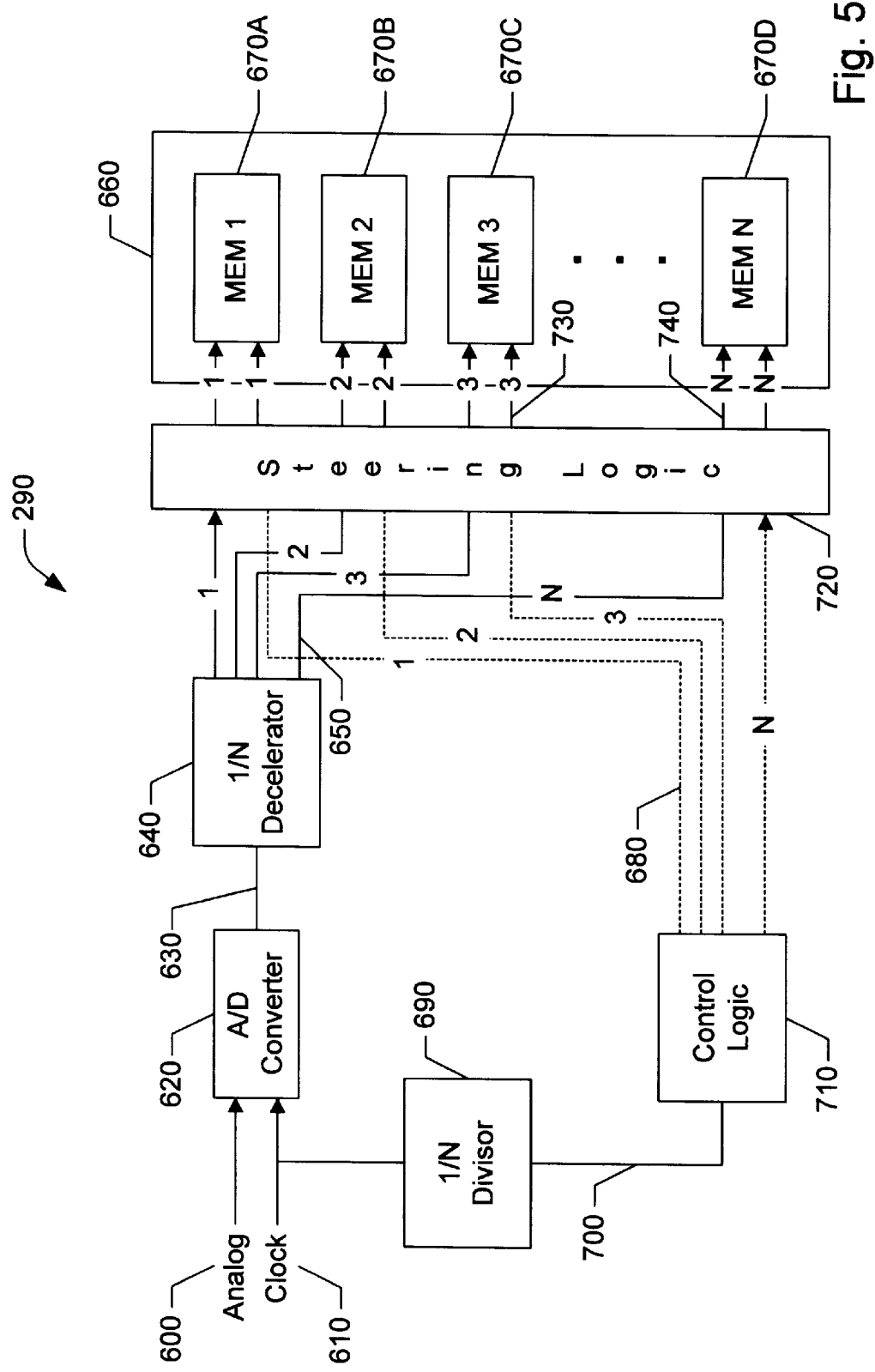
FIG. 5 shows a block diagram of a data acquisition board with a selectable sampling rate and steering logic.

FIG. 5 shows an alternative embodiment of the present invention wherein steering logic 720 is added between parallel data samples 650 and store-enable signals 680 and memory 660. A system without steering logic 720 does not make efficient use of all the memory space when M (how many samples to skip before storing a sample) and N (the number of memory partitions) are not relatively prime. (Two numbers are relatively prime if their greatest common divisor (GCD) is equal to 1.) If, for example, N=4 and M=2, only the second and fourth memory partitions will ever receive a store-enable signal. The first and third memory partitions will remain empty. Steering logic 720 overcomes this problem by cycling the decelerator outputs that correspond to store-enable signals through all the available memory partitions in sequence. For example, if M=2 and N=4, the contents of the memory partitions after a few iterations may be:

| Memory partition | Contents (sample #s present) |
|---|---|
| 1 | 2, 10, 18 |
| 2 | 4, 12, 20 |
| 3 | 6, 14, 22 |
| 4 | 8, 16, 24 |

For the same example and without steering logic 720, the contents of the memory partitions would have been:

| Memory partition | Contents (sample #s present) |
|---|---|
| 1 |  |
| 2 | 2, 6, 10, 14 |
| 3 |  |
| 4 | 4, 8, 12, 16 |

Steering logic 720 receives the outputs of the decelerator and the store enable signals and provides the data to the memory partitions in sequence. Steering logic 720 thus effectively collates the data for optimum usage of the memory in such of the memory partitions. In the preferred embodiment of the invention, the steering logic 270 comprises one or more multiplexers for collating the data.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A data acquisition system for sampling and storing analog data at a selectable clock frequency, the data acquisition system comprising:

an analog-to-digital converter (ADC) configured to receive the analog data and a first clock signal having a first clock frequency F1, wherein said ADC is operable to sample the analog data at said first clock frequency F1 and convert samples of the analog data into digital data samples;

a decelerator including an input coupled to said ADC and configured to receive said digital data samples, wherein said decelerator is operable to receive and store N digital data samples, wherein said decelerator includes N outputs, wherein said decelerator is operable to output said N digital data samples on said N outputs in a parallel fashion, wherein said decelerator is operable to output said N digital data samples at a second clock frequency F2 equal to F1/N, and wherein said decelerator repetitively operates to receive and store N digital data samples and output said N digital data samples in said parallel fashion;

a memory comprising a plurality N of memory partitions, wherein each of said N memory partitions is coupled to one of said N outputs of said decelerator and wherein each of said N memory partitions is configured to receive digital data samples from said decelerator;

a control logic unit configured to receive a second clock signal having said second frequency F2, wherein said control logic unit generates a sequence of N store-enable signals at said second frequency F2, wherein each of said N store enable signals is provided to one of said N memory partitions; wherein said N store-enable signals are generated with a pattern of enable and non-enable bits to selectively store data in said N memory partitions, and wherein said pattern is configured to generate a sample rate for said analog data.

2. The data acquisition system of claim 1, wherein said first clock frequency F1 is 1 GHz.

3. The data acquisition system of claim 1, wherein N is 8 and wherein said second clock frequency F2 is 125 MHz.

4. The data acquisition system of claim 1, further comprising a clock divisor configured to receive said first clock signal, wherein said clock divisor generates said second clock signal having said second clock frequency F2.

5. The data acquisition system of claim 1, wherein said memory partitions comprise first-in-first-out memory (FIFO).

6. The data acquisition system of claim 1, wherein when said N store-enable signals are placed in sequence every Mth of said store-enable signals is enabling, all others of said store-enable signals are non-enabling;

wherein said pattern of enable and non-enable bits in said N store-enable signals are configured to generate a sample rate of F1/M for said analog data.

7. The data acquisition system of claim 1, further comprising a steering logic coupled to said decelerator, said control logic unit, and said memory, wherein said steering logic is configured to receive said N digital data samples from said decelerator and said N store-enable signals from said control logic unit in place of said N memory partitions, wherein said steering logic outputs, to said N memory partitions, only a subset of said N digital data samples that corresponds to a subset of said N store-enable signals comprising enable bits, wherein only said subset of said N digital data samples is output in sequence and in a cyclical fashion to said N memory partitions.

8. A method for sampling and storing data at a selectable clock frequency, the method comprising:

receiving an analog data signal;

performing analog-to-digital conversion on said analog data signal to generate digital data samples at a first frequency F1;

accumulating N of said digital data samples in a buffer;

outputting said N digital data samples in a parallel fashion at a second frequency F2=F1/N to a plurality N of memory partitions; and providing respective store-enable signals to each of the N memory partitions at a second frequency F2=F1/N, wherein said store-enable signals are generated with a pattern of enable and non-enable bits in order to provide an effective sampling rate for said analog data.

9. The method of claim 8, wherein said memory partitions comprise first-in-first-out memory (FIFO).

10. The method of claim 8, wherein when said N store-enable signals are placed in sequence every Mth of said store-enable signals is enabling, all others of said store-enable signals are non-enabling;

wherein said pattern of enable and non-enable bits in said N store-enable signals are configured to generate a sample rate of F1/M for said analog data.

11. The method of claim 8, further comprising receiving said N digital data samples and corresponding said N store-enable signals and outputting, to said N memory partitions, only a subset of said N digital data samples that corresponds to a subset of said N store-enable signals comprising enable bits, wherein only said subset of said N digital data samples is output in sequence and in a cyclical fashion to said N memory partitions.

12. A data acquisition system for sampling and storing analog data at a variable clock frequency, the data acquisition system comprising:

an analog-to-digital converter (ADC) configured to receive the analog data and a first clock signal having a first clock frequency, wherein said ADC is operable to sample the analog data at said first clock frequency and convert the analog data into a plurality of digital data samples;

a decelerator configured to receive said digital data samples, wherein said decelerator is operable to store every N of said digital data samples and convert said N of said digital data samples into N parallel digital data samples output at a second clock frequency, wherein said second clock frequency is equal to said first clock frequency divided by said number N;

a memory partitioned into N memory partitions, wherein each of said N memory partitions is configured to receive one of said N parallel digital data samples and further wherein each of said N memory partitions is configured to receive one of N store-enable signals, wherein said store-enable signals determine whether one of said N memory partitions stores a corresponding one of said N parallel digital data samples;

a clock divisor configured to receive said first clock signal, wherein said clock divisor is operable to generate a second clock signal oscillating at a second clock frequency; and a control logic unit configured to receive said second clock signal, wherein said control logic unit is operable to generate a sequence of N store-enable signals at said second clock frequency and wherein a pattern of said N store enable signals determines an effective sampling rate of the analog data.

13. The data acquisition system of claim 12, wherein said first clock frequency is 1 GHz.

14. The data acquisition system of claim 12, wherein said memory partitions comprise a first-in-first-out memory (FIFO) or random access memory (RAM).

15. The data acquisition system of claim 12, wherein said N store-enable signals, when placed in sequence, have every Mth of said store-enable signals be enabling, all others of said store-enable signals be non-enabling;

wherein said pattern of enable and non-enable bits in said N store-enable signals are configured to generate a sample rate of F1/M for said analog data.

16. The data acquisition system of claim 12, further comprising a steering logic coupled to said decelerator, said control logic unit, and said memory, wherein said steering logic is configured to receive said N digital data samples from said decelerator and said N store-enable signals from said control logic unit in place of said N memory partitions, wherein said steering logic outputs, to said N memory partitions, only a subset of said N digital data samples that corresponds to a subset of said N store-enable signals comprising enable bits, wherein only said subset of said N digital data samples is output in sequence and in a cyclical fashion to said N memory partitions.

* * * * *